United States Patent
Kang et al.

(10) Patent No.: US 7,468,512 B2
(45) Date of Patent: Dec. 23, 2008

(54) COMPUTER PROGRAM PRODUCTS FOR MEASURING CRITICAL DIMENSIONS OF FINE PATTERNS USING SCANNING ELECTRON MICROSCOPE PICTURES AND SECONDARY ELECTRON SIGNAL PROFILES

(75) Inventors: Min-Sub Kang, Gyeonggi-do (KR); Sang-Kil Lee, Gyeonggi-do (KR); Kwang-Sik Kim, Gyeonggi-do (KR); Kyung-Ho Jung, Incheon-si (KR); Sung-Joong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 164 days.

(21) Appl. No.: 11/426,713

(22) Filed: Jun. 27, 2006

(65) Prior Publication Data

US 2006/0231753 A1  Oct. 19, 2006

Related U.S. Application Data

(62) Division of application No. 11/008,477, filed on Dec. 9, 2004, now Pat. No. 7,091,485.

(30) Foreign Application Priority Data

Dec. 11, 2003  (KR)  .......................... 2003-0090187

(51) Int. Cl.
*G01N 23/00* (2006.01)
(52) U.S. Cl. ....................... 250/307; 250/306
(58) Field of Classification Search .................. 250/307
See application file for complete search history.

(56) References Cited

U.S. PATENT DOCUMENTS

| | | | |
|---|---|---|---|
| 5,006,795 A * | 4/1991 | Yoshizawa et al. | 324/751 |
| 6,259,960 B1 * | 7/2001 | Inokuchi | 700/110 |
| 6,538,249 B1 | 3/2003 | Takane et al. | |
| 6,548,811 B1 * | 4/2003 | Nakamura et al. | 250/311 |
| 6,563,114 B1 | 5/2003 | Nagahama et al. | |
| 6,583,413 B1 | 6/2003 | Shinada et al. | |
| 6,614,923 B1 * | 9/2003 | Shishido et al. | 382/149 |
| 6,855,929 B2 * | 2/2005 | Kimba et al. | 250/310 |
| 6,984,589 B2 * | 1/2006 | Tanaka et al. | 438/714 |
| 7,263,216 B2 * | 8/2007 | Shishido et al. | 382/149 |
| 2004/0086170 A1 * | 5/2004 | Shishido et al. | 382/149 |

FOREIGN PATENT DOCUMENTS

JP  2002-289128 A  10/2002

* cited by examiner

*Primary Examiner*—Jack I Berman
*Assistant Examiner*—Andrew Smyth
(74) *Attorney, Agent, or Firm*—Myers Bigel Sibley & Sajovec

(57) ABSTRACT

A pattern is inspected by acquiring a scanning electron microscope picture of an inspection pattern, and acquiring a scanning electron microscope secondary electron signal profile of the inspection pattern. A determination is made as to whether the inspection pattern is defective by comparing the scanning electron microscope picture of the inspection pattern to a scanning electron microscope picture of a sample pattern, and by comparing the scanning electron microscope secondary electron signal profile of the inspection pattern to a scanning electron microscope secondary electron signal profile of a sample pattern.

4 Claims, 6 Drawing Sheets

COMPUTER PROGRAM PRODUCTS FOR MEASURING CRITICAL DIMENSIONS OF FINE PATTERNS USING SCANNING ELECTRON MICROSCOPE PICTURES AND SECONDARY ELECTRON SIGNAL PROFILES

CROSS-REFERENCE TO RELATED APPLICATIONS

This application is a divisional of application Ser. No. 11/008,477, filed Dec. 9, 2004, entitled Methods and Systems for Measuring Critical Dimensions of Fine Patterns Using Scanning Electron Microscope Pictures and Secondary Electron Signal Profiles, and claims the benefit under 35 U.S.C. § 119 of Korean Patent Application 2003-90187, filed Dec. 11, 2003, the disclosure of which is hereby incorporated herein by reference in its entirety as if set forth fully herein.

FIELD OF THE INVENTION

The present invention relates to methods, systems and computer program products for measuring a width of a fine pattern, and more specifically to methods, systems and computer program products for measuring a width of a fine pattern using a scanning electron microscope.

BACKGROUND OF THE INVENTION

The Scanning Electron Microscope (SEM) is an external observation device for projecting an electron beam onto a sample and detecting reflected secondary electrons to display a picture with pixels having a luminosity proportional to the number of secondary electrons. An SEM may be used for external inspecting and measuring a line width of fine patterns and micro dimensions.

In a semiconductor fabrication process, a line width of a fine pattern of a semiconductor device may be measured using a scanning electron microscope. A conventional method for measuring a micro line width uses a picture to judge a similarity between an inspection pattern and a standard pattern (i.e., pattern matching). That is, an SEM image of a standard pattern is compared with an SEM image of a real inspection pattern by pixels. A line width is measured only when the inspection pattern is determined to be non-defective as a result of the comparison. That is, the line width is not measured when the inspection pattern is determined to be defective.

However, according to the conventional method for matching a pattern, a pattern that is within a permissible modification range of a process may be determined to be defective. In this case, the measuring of line width may not be performed even though the measuring should be performed.

SUMMARY OF THE INVENTION

Some embodiments of the invention measure a fine pattern by pattern matching using a secondary electron signal profile. A secondary electron signal profile of an inspection pattern and a secondary electron profile of a standard pattern are compared to determine whether the inspection pattern is non-defective or defective.

In some embodiments, a secondary electron signal profile is acquired from a scanning electron microscope picture. The pattern matching using the secondary electron signal profile judges modifications of the inspection pattern to be non-defective when the modifications are within a permissible range.

In some embodiments, the secondary electron signal profile can be acquired by a secondary electron signal measured along a line connecting two measuring points of a scanning electron microscope picture. For a contact hole pattern, both measuring points may be measured by rotating on a center of the contact hole for several times, and an average thereof may be determined for the secondary electron signal.

Pattern matching using the secondary electron signal profile can compare and determine a peak height $H_p$ and a distance $D_p$ between the peaks, or a slant distance $S_p$ of a peak and a horizontal distance $D_s$ of a slant of the secondary electron signal profiles.

In other exemplary embodiments of the present invention, pattern matching is performed by comparing the secondary electron signal profiles of the inspection pattern and the standard pattern and by comparing pictures of the inspection pattern and the standard pattern by pixels.

In some embodiments, if the inspection pattern is determined to be defective by comparing the scanning electron microscope picture of the inspection pattern with the scanning electron microscope picture of the standard pattern, pattern matching may be performed, using the secondary electron signal profiles.

Specifically, methods of measuring a fine pattern according to some exemplary embodiments of the present invention acquire a scanning electron microscope of inspection pattern. A secondary electron signal profile of the inspection pattern is acquired from the scanning electron microscope picture of the inspection pattern. A determination is made as to whether the inspection pattern is defective by comparing a standard secondary electron signal profile with the secondary electron signal profile of the inspection pattern. Finally, a line width of an inspection pattern that is determined to be non-defective is measured.

Methods for measuring a fine pattern according to other exemplary embodiments of the present invention load a sample on a stage of a scanning electron microscope and move to an inspection pattern on the sample to acquire a secondary electron signal profile and a scanning electron microscope picture of the inspection pattern. A determination is made as to whether the inspection pattern is defective by comparing the scanning electron microscope picture of the inspection pattern and the secondary electron signal profile thereof with a scanning electron microscope of a standard pattern and a secondary electron signal profile thereof, respectively. Finally, a line width of an inspection pattern that is determined to be non-defective is measured.

Other embodiments of the present invention provide systems for measuring a line width. A picture forming unit is configured to form a scanning electron microscope picture of an inspection pattern. A secondary electron signal profile forming unit is configured to form a secondary electron signal profile from the scanning electron microscope picture of the inspection pattern. A storage unit is configured to store a scanning electron microscope picture and a secondary electron signal profile of a standard pattern. A pattern matching unit is configured to determine whether the inspection pattern is non-defective or defective by comparing the scanning electron signal microscope pictures and the secondary electron signal profiles. Finally, a measuring unit is configured to measure a line width of an inspection pattern that is determined to be non-defective.

Still other embodiments of the present invention provide computer program products. Computer-readable program code is configured to form a scanning electron microscope picture of an inspection pattern in the computer. Computer-readable program code is also configured to form a secondary electron signal profile from the scanning electron signal microscope picture of the inspection pattern. Computer-readable program code is also configured to store a scanning electron microscope picture and secondary electron signal profile of a standard pattern. Computer-readable program code is also configured to determine whether the inspection pattern is non-defective or defective by comparing the scanning electron microscope pictures and the secondary electron signal profiles. Finally, computer-readable program code is also configured to measure a line width of the inspection pattern that is determined to be non-defective.

DETAILED DESCRIPTION OF PREFERRED EMBODIMENTS

Figure 1:
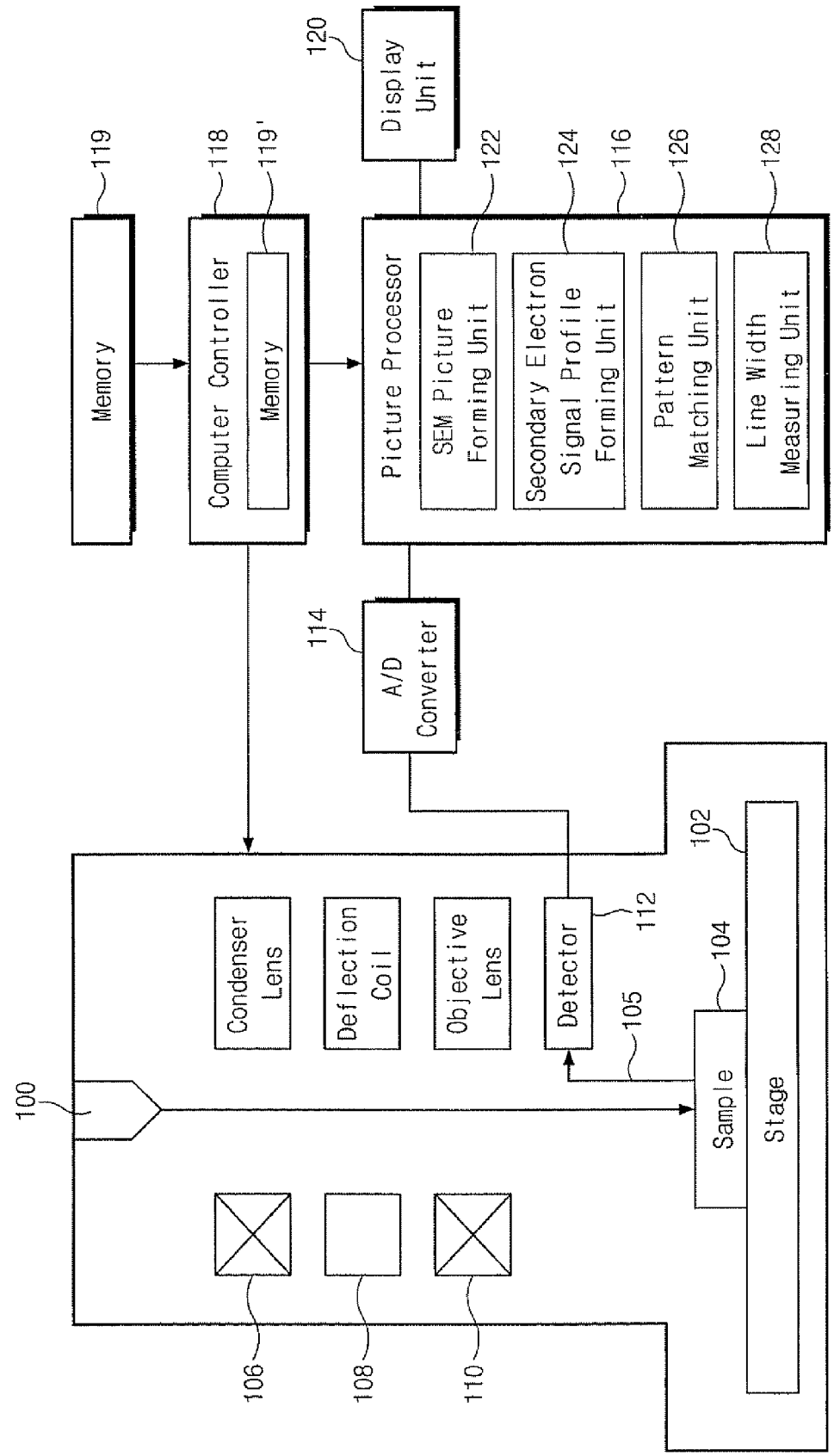
FIG. 1 is a block diagram illustrating systems, methods and computer program products for measuring a line width of fine patterns according to various embodiments of the present invention.

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

The present invention is described below with reference to block diagrams and/or flowchart illustrations of methods, apparatus (systems) and/or computer program products according to embodiments of the invention. It is understood that each block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Finally, it will be understood that, although the terms first, second, etc. may be used herein to describe various elements, these elements should not be limited by these terms. These terms are only used to distinguish one element from another.

The present invention relates to methods, systems and computer program products for measuring a fine pattern using a scanning electron microscope. Embodiments of the present invention can be employed to measure a line width of the fine pattern in a semiconductor fabrication process. Methods for measuring a line width of a pattern can match a standard pattern with an inspection pattern. Embodiments of the present invention can use a picture and a secondary electron signal profile. The pattern matching using a secondary electron signal profile may be more accurate than the pattern matching using a picture.

FIG. 1 illustrates micro line width measuring systems, methods and computer program products using a scanning electron microscope in accordance with various embodiments of the present invention. An electron beam 100 is projected from an electron beam source and scanned to a sample 104 lying on a stage 102 by operation of a condenser lens 106, a deflection coil 108 and an objective lens 110. In this case, secondary electrons 105 are projected from the sample 104 due to the electron beam 100 scanned on the sample. The secondary electrons 105 projected from the sample 104 are detected by a detector 112 and converted into an electric signal. The converted electric signal is converted to a digital signal by an analog/digital (A/D) converter 114 and processed by a picture processor 116, thereby seen on a screen of a display unit 120. A computer controller 118 controls the operations. The computer controller 118 and the picture processor 116 may be embodied as one or more enterprise, application, personal, pervasive and/or embedded computer systems, and may also be combined into one or more enterprise, application, personal, pervasive and/or embedded computer systems.

The picture processor 116 comprises a scanning electron microscope picture forming unit 122, a secondary electron profile forming unit 124, a pattern matching unit 126, and a line width measuring unit 128. The scanning electron microscope picture forming unit 122 processes the digital signal received from the analog/digital converter 114 to form a scanning electron microscope picture. For instance, the scanning electron microscope forming unit 122 may include a memory as a storage for storing the formed picture. The luminosity of each pixel comprising the picture of the scanning electron microscope depends on an intensity of the secondary electrons projected from the sample 104. As an amount of the projected secondary electrons becomes larger, the pixel becomes brighter. The picture of the scanning electron microscope comprises pixels arranged in a plane (i.e., in two-dimensions).

The secondary electron signal profile forming unit 124 forms a secondary electron signal profile for indicating an intensity of the secondary electrons projected in a specific direction of the inspection pattern (a direction of measuring a line width). For example, the secondary electron signal profile forming unit 124 may include a memory as a storage for storing the secondary electron signal profile.

The pattern matching unit 126 confirms a similarity between the inspection pattern and a prestored standard pattern. Information on the standard pattern (i.e., information on the picture of the scanning electron microscope and the secondary electron signal profile with respect to the standard pattern) is stored in an additional memory 119 and read by the computer 118 and/or stored in an internal memory 119' of the computer 118. Alternatively, the information on the standard pattern may be stored in a memory (not shown) in the picture processor 116. The pattern matching unit 126 determines a similarity between the standard pattern and the inspection pattern (e.g., whether the inspection pattern is defective or non-defective) through a comparison of pictures of the scanning electron microscope and a comparison of the secondary electron signal profiles. When the inspection pattern is determined to be non-defective by the pattern matching unit 126, the line width measuring unit 128 measures a line width of the inspection pattern.

Referring to FIGS. 2 through 5, pattern matching according to various embodiments of the present invention will be explained, as may be performed by the pattern matching unit 126.

Figure 2:
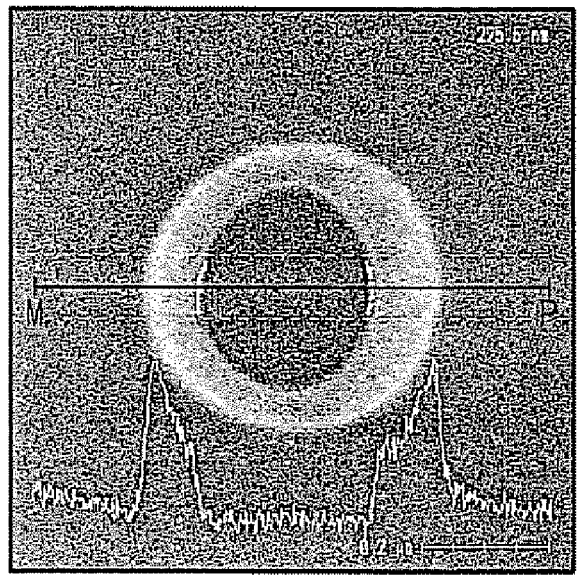
FIG. 2 and FIG. 3 illustrate scanning electron microscope pictures of inspection patterns for a contact hole and secondary electron signal profiles with respect to one cross-section thereof.
Figure 3:
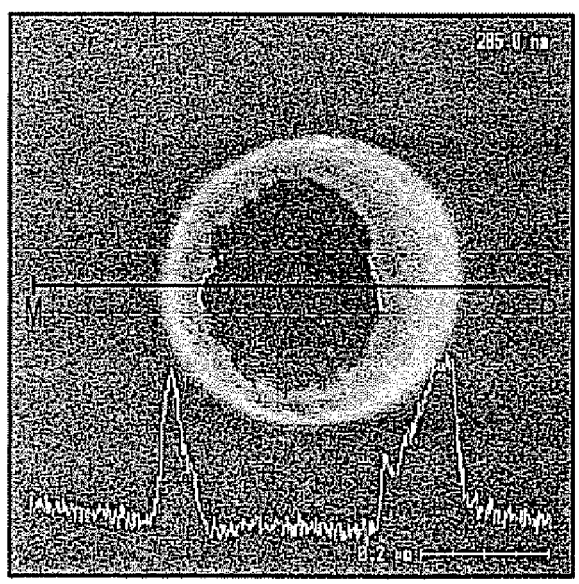

FIG. 2 illustrates a picture of a non-defective pattern and a secondary electron signal profile shown in the display unit 120 and FIG. 3 illustrates a picture of a modified pattern in a permissible error range and a secondary electron signal profile shown in the display unit 120. The non-defective pattern of FIG. 2 may constitute a standard pattern and the modified pattern of FIG. 3 may constitute an inspection pattern in some embodiments. In the drawings, a line MP indicates a direction of measuring a line width. As the number of secondary electrons projected from around an edge of the inspection pattern is large, and as the number (the intensity) of projected secondary electrons becomes larger (higher), the pixels comprising a picture of the scanning electron microscope are displayed more brightly. Therefore, it will be understood that the patterns in FIGS. 2 and 3 are contact holes.

Figure 4:
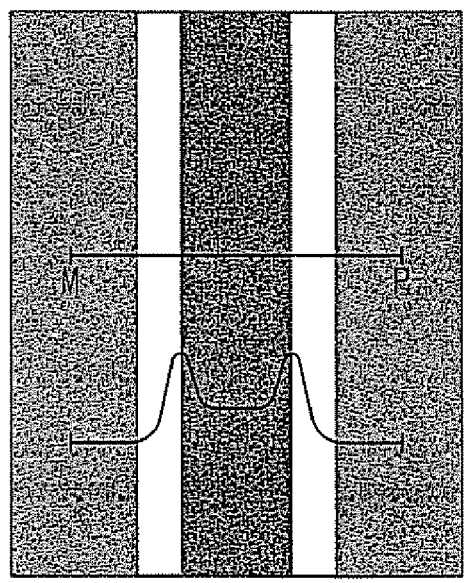
FIG. 4 and FIG. 5 illustrate scanning electron microscope pictures of inspection patterns for lines and secondary electron signal profiles with respect to one cross-section thereof.
Figure 5:
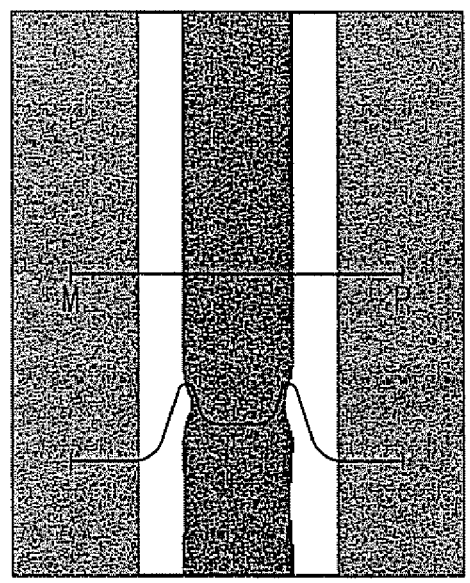

Meanwhile, FIGS. 4 and 5 show typical diagrams of the scanning electron microscope pictures with respect to a line pattern and a modified pattern in a permissible range. The non-defective pattern of FIG. 4 may constitute a standard pattern and the modified pattern of FIG. 5 may constitute an inspection pattern in some embodiments.

The secondary electron signal profile (or waveform) displayed on the bottom of the scanning electron microscope picture indicates an intensity of the secondary electron signal achieved along the line MP of the picture. Two measurement points are placed on the line MP for measuring a line width.

To remove a noise element (to allow improved S/N ratio), signal processing can be applied to the secondary electron signal profile. For example, to allow improved S/N ratio, an arithmetic average, moving average, etc. can be applied. In the arithmetic average, a plurality of secondary electron signal profiles are acquired from a picture of the secondary scanning electron microscope and averaged to acquire a non-defective secondary electron signal profile.

To compute an average for a pattern of a contact hole, both measurement points for measuring a line width may be rotated around a center of the contact hole (the line MP is rotated around a center of the contact hole) and measured for several times to achieve an average value. Meanwhile, for a line pattern, both measurement points may be moved along a line pattern (the line MP is moved up and down along the line pattern) and measured for several times to determine an average value.

In the moving average, the secondary electron profile is flatted to improve the profile using a moving average with respect to the secondary electron signal profile. For example, when a signal of the nth pixel is S (n) and N number of pixels are moving averaged, the nth pixel signal S'(n) of which noise may be improved is given as follows:

$$S(n) = \frac{\sum_{i=-L}^{i=+L} S(n+i)}{N} \quad \text{(where } L = (N-1)/2\text{)}.$$

Equation (1)

Referring to FIGS. 2, 3, 4 and 5, the scanning electron microscope pictures are somewhat different but the secondary electron signal profiles thereof are the same practically. Therefore, according to some embodiments of the present invention, both the scanning electron microscope pictures and the secondary electron signal profiles are used for a pattern matching.

First, pattern matching will be explained through a comparison of the scanning electron microscope pictures according to some embodiments of the present invention. Pixels comprising a picture of the scanning electron microscope with respect to the inspection pattern are compared with corresponding pixels comprising a standard scanning electron microscope picture to show the result as a score. As a result, if the score is higher than a preset threshold value, the inspection pattern is determined to be a non-defective pattern and if not, the inspection pattern is determined to be a defective pattern. The score dividing the similarity between the inspection pattern and the standard pattern may be acquired from a correlation coefficient calculated from Equation (2) using a normalized correlation between the pixels comprising the two scanning electron microscope pictures:

$$r(X, Y) = \frac{\left[N\sum_{i,j} P_{ij}M_{ij} - \left(\sum_{i,j} P_{ij}\right)\left(\sum_{ij} M_{ij}\right)\right]}{\sqrt{\left[N\sum_{i,j} P_{ij}^2 - \left(\sum_{i,j} P_{ij}^2\right)^2\right]\left[N\sum_{i,j} M_{ij}^2 - \left(\sum_{i,j} M_{ij}^2\right)^2\right]}}.$$

Equation (2)

In the above Equation (2), $P_{ij}$ refers to a concentration at pixel (i, j) of the picture of the inspection pattern (i.e., an intensity of secondary electrons), and $M_{ij}$ refers to a concentration at pixel (i, j) of the picture of the standard pattern.

When a correlation coefficient acquired from Equation (2) is r, the score (s) is given as follows:

$$s=1000r^2.$$

Equation (3)

When the score is 1000, the inspection pattern agrees with the standard pattern completely. As the score approaches 1000, the similarity between the two patterns increases. The inspection pattern is determined to be non-defective if the score is higher than a threshold value as a result of the matching, and defective if the score is less than the threshold value.

Figure 6:
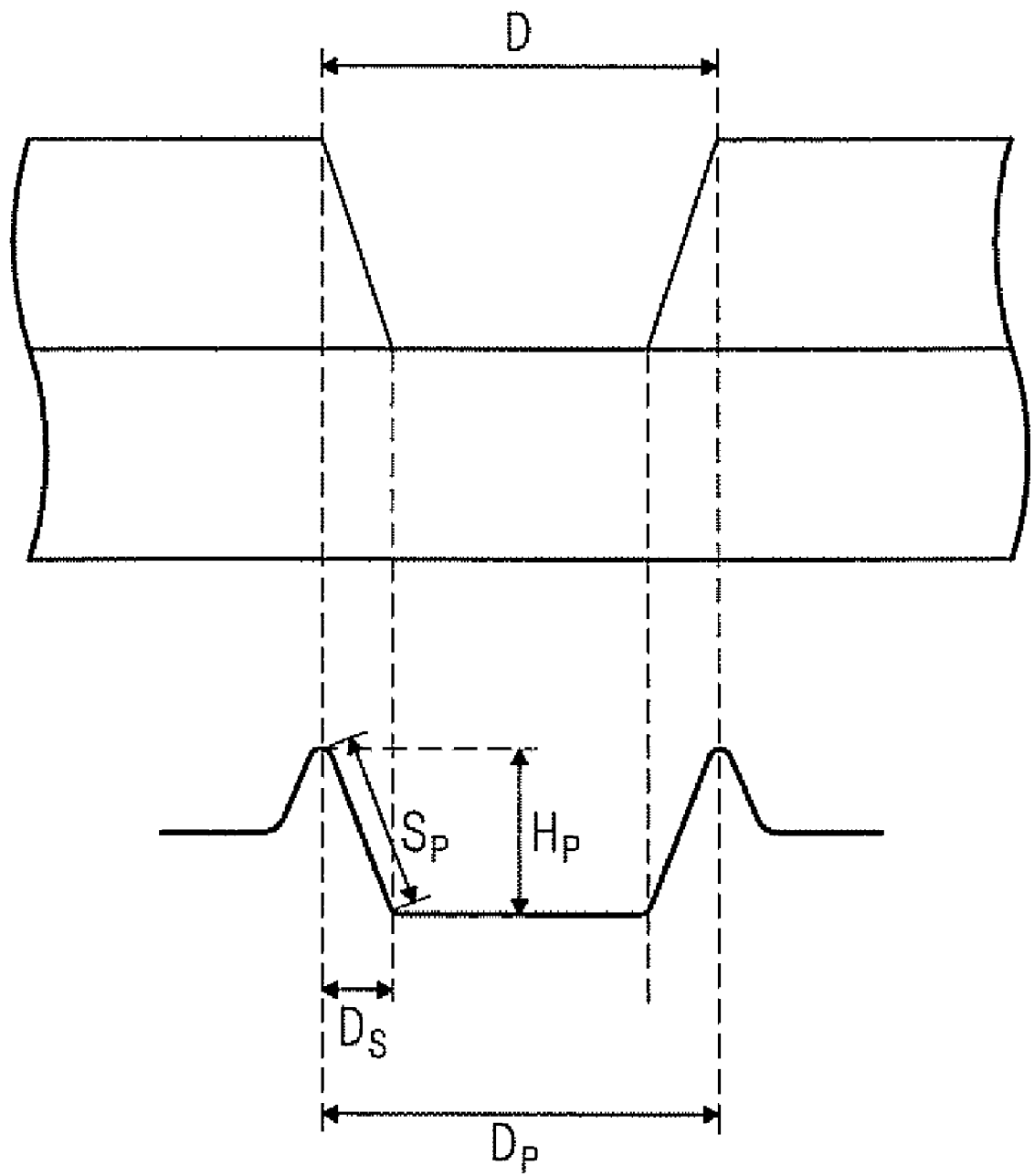
FIG. 6 illustrates a cross-section of a contact hole pattern and a secondary signal profile thereof.

Next, pattern matching using a secondary electron signal profile will be explained with reference to FIG. 6. FIG. 6 illustrates a schematic cross-section of the contact hole pattern and a secondary electron signal profile with respect to the cross-section of the contact hole pattern. As is well known, the secondary electron signal profile indicates a peak around an inclined edge of the inspection pattern. That is, the signal intensity of the secondary electron pattern is large around the edge of the pattern.

For example, in some embodiments of the present invention, the pattern matching using the secondary electron signal profile considers peak heights $H_p$ and distances $D_p$ between the peaks, or slant distances of peak $S_p$ and horizontal distances of a slant $D_s$ of the secondary electron signal profiles with respect to two patterns. In this case, the peak height $H_p$ means a vertical distance between a highest point and the lowest point. The highest point corresponds to an upper edge of the inspection pattern and the lowest point corresponds to a bottom edge of the inspection pattern. The slant distance of peak $S_p$ means a distance of the line connecting the highest and lowest points of the secondary electron profile. The horizontal distance of slant $D_s$ means a horizontal distance between the highest and lowest points of the secondary electron signal profile.

As the peak height $H_p$ becomes higher, the contact hole becomes deeper. In contrast, as the peak height $H_p$ becomes lower, the contact hole becomes shallower. In addition, as the slant distance $S_p$ and the horizontal distance $D_s$ become larger, the inclination of the contact hole becomes gentler.

According to some embodiments of the present invention, the peak height of the standard pattern is compared with the peak height of the inspection pattern to determine whether the inspection pattern is non-defective or defective. The result can be expressed as a score. When the peak height of standard pattern is R_Hp and the peak height of inspection pattern is S_Hp, the score s may be given by the following Equation (4):

$$s=\{(R\_Hp-S\_Hp)/R\_Hp\}*100.$$

Equation (4)

If the score is smaller than a given value Tv (0<Tv<100), the inspection pattern is determined to be non-defective. As the given value becomes smaller, the pattern matching is more accurately performed.

Similarly, in some embodiments, the slant distance of the standard pattern and the slant distance of the inspection pattern, and the peak distance of standard pattern and the peak distance of the inspection pattern may be compared to perform a pattern matching.

In addition, in some embodiments, the horizontal distance of slant of the standard pattern is compared with the horizontal distance of slant of the inspection pattern to determine whether the inspection pattern is non-defective or defective.

According to pattern matching using the above-described scanning electron microscope, the modified patterns in FIGS. 3 and 5 can be determined to be defective. However, the secondary electron profiles with respect to the two pictures are closely similar, such that the modified patterns in FIGS. 3 and 5 are determined to be non-defective. Meanwhile, the non-defective patterns in FIGS. 2 and 4 may be determined to be non-defective by both pattern matching methods.

Figure 7:
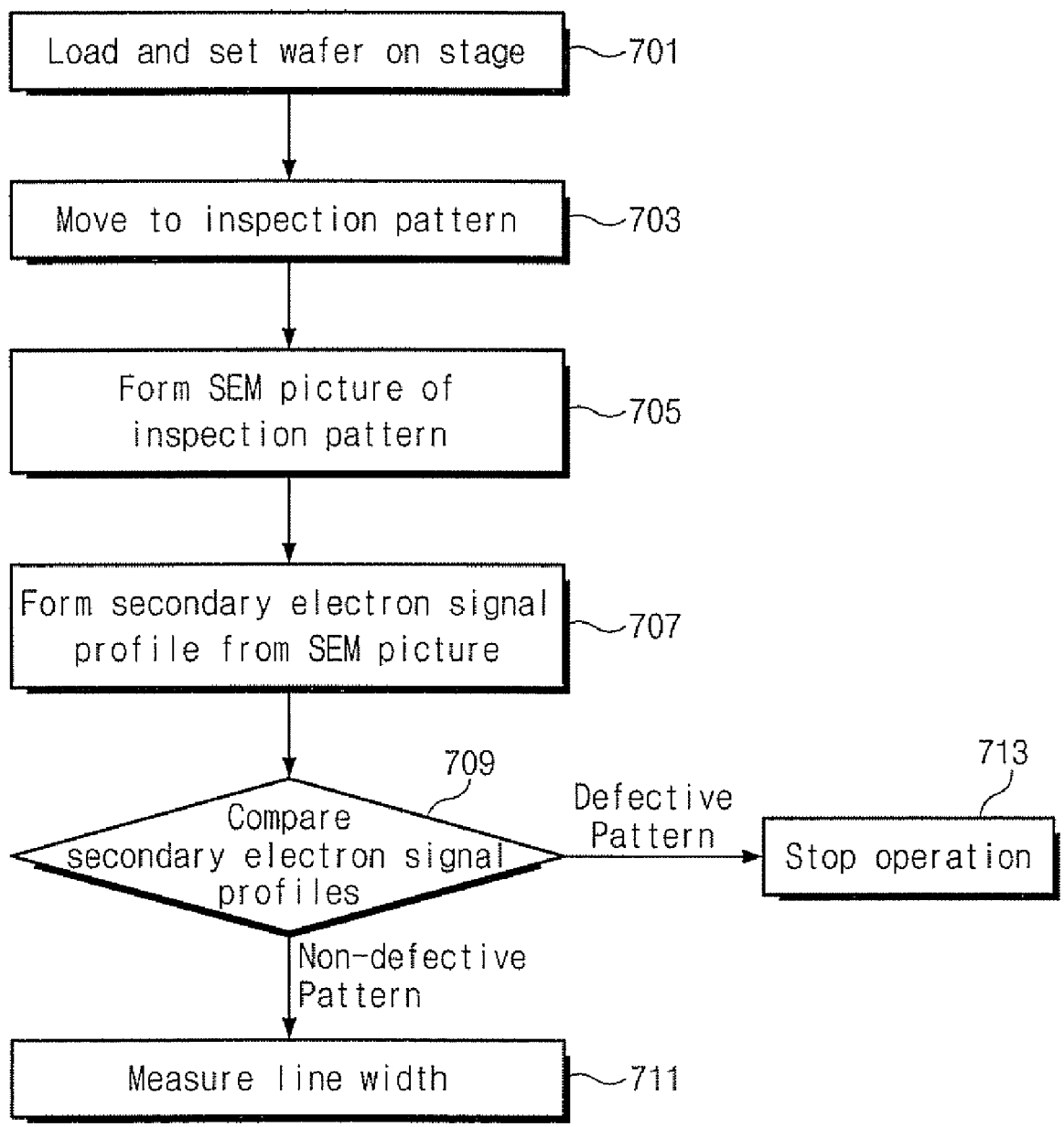
FIG. 7 is a flowchart of operations for measuring line widths of fine patterns according to various embodiments of the present invention.

FIG. 7 is a flowchart of operations for measuring a line width of a fine pattern according to exemplary embodiments of the present invention using, for example, embodiments of FIG. 1. Measuring a line width of a fine pattern formed in a semiconductor fabrication process will now be explained with reference to FIGS. 1 and 7.

First, a sample with an inspection pattern is loaded on a stage 102 of the scanning electron microscope and a wafer is set on the stage 102 by an auto aligning operation at Block 701.

The stage 102 and/or an electron beam 100 is transferred by auto aligning and/or auto addressing, so as to move an observation field of the scanning electron microscope to the inspection pattern formed on the wafer as shown in Block 703. The auto aligning and auto addressing are controlled by the computer 118.

The electron beam 100 is projected from an electron beam source, using a condenser lens 106, a deflection coil 108 and an objective lens 110, to impinge on the inspection pattern on the wafer 104. In this case, secondary electrons 105 projected from the inspection pattern are detected by a detector 112 and converted to an electric signal. The converted electric signal is converted into a digital signal by an analog/digital converter 114 to form a picture with respect to an inspection pattern by an SEM picture forming unit 122, as shown at Block 705. The SEM picture may be shown on a screen of display unit 120. Focus, magnification, etc. can be automatically controlled in forming the SEM picture.

Continuously, a secondary electron profile forming unit 124 acquires the secondary electron signal profile using the SEM picture as fully explained above, at Block 707. The secondary electron signal profile may be displayed on the screen of display unit 120 and may be displayed overlapping the SEM picture acquired in Block 705, as shown in FIGS. 2 through 5.

The pattern matching unit 126 performs pattern matching using secondary electron signal profiles with respect to SEM pictures of a prepared standard pattern read by the computer 118 and an inspection pattern acquired from the secondary electron signal profile forming unit 124, at Block 709. The pattern matching may be performed as explained above.

If the pattern is determined to be non-defective (i.e., the pattern is in the range of permissible process modification), a line width measuring unit 128 measures the line width of the inspection pattern at Block 711. Meanwhile, if the pattern is determined to be defective (i.e., the pattern is beyond the permissible process modification), the operation for measuring the line width is stopped at Block 713. In this case, a proper treatment should follow because the pattern forming process may have a large error.

Figure 8:
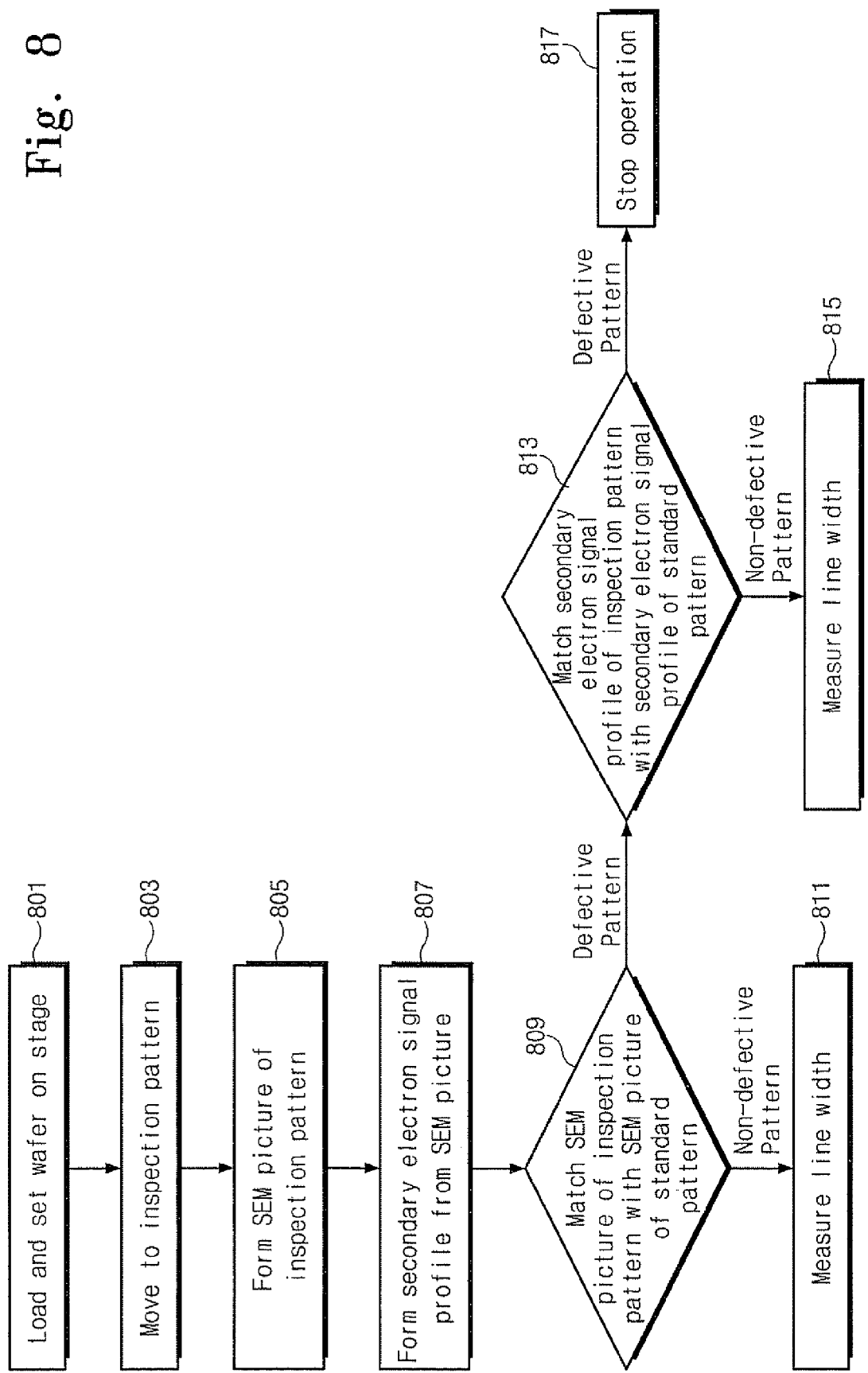
FIG. 8 is a flowchart of operations for measuring line widths of fine patterns according to other embodiments of the present invention.

FIG. 8 is a flowchart of operations for measuring a line width according to other exemplary embodiments of the present invention. Blocks 701 through 707 illustrated in FIG. 7 are carried out as Blocks 801 through 807 in FIG. 8.

Next, a pattern matching unit 126 compares the SEM picture of inspection pattern with the SEM picture of standard pattern to perform pattern matching, at Block 809.

If the pattern is determined to be non-defective by the comparison of SEM pictures, a measuring unit 128 measures a line width of the inspection pattern at Block 811. In contrast, if the pattern is determined to be defective as a result of the comparison of SEM pictures (even if the pattern is in a permissible error range), the pattern matching unit 126 performs the pattern matching again, so as to allow improved reliability of pattern matching. In this case, the secondary electron profile of the inspection pattern is compared with the secondary electron profile of a standard pattern to perform the pattern matching. If the pattern is determined to be non-defective, the measuring unit 128 measures a line width of the inspection pattern at Block 815. If determined to be defective, the process is stopped at Block 817. In this case, the process may have a large error, and a proper treatment should be carried out.

A method for measuring a line width by the measuring unit 128 will now be explained. The line width of the inspection pattern is measured using the secondary electron signal profile that is used in the pattern matching. In some embodiments, S/N ratio with respect to the secondary electron signal profile may be improved using the above explained arithmetic average, the moving average, etc.

A secondary electron signal of a non-defective profile is acquired and then a line width of the inspection pattern is measured. Two measuring points are decided on the secondary electron signal profile so as to measure the line width. Then, a distance between the two measuring points is measured. A technique for deciding the two measuring points includes a well-known threshold method, a peak detecting method, a function modeling, etc.

According to some embodiments of the present invention, the inspection pattern is determined to be non-defective or defective finally using the secondary electron signal profile. Therefore, a modified pattern in a permissible error range can be determined to be non-defective instead of being treated as defective, which may stop a fabrication process. Therefore, reliable line width measuring can be provided.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A computer program product that is configured to inspect a pattern, the computer program product comprising a computer usable storage medium having computer-readable program code embodied in the mediums the computer-readable program code comprising:

computer-readable program code that is configured to acquire a scanning electron microscope picture of an inspection pattern;

computer-readable program code that is configured to acquire a scanning electron microscope secondary electron signal profile of the inspection pattern using the scanning electron microscope picture; and computer-readable program code that is configured to determine whether the inspection pattern is defective by comparing the scanning electron microscope picture of the inspection pattern to a scanning electron microscope picture of a sample pattern and by comparing the scanning electron microscope secondary electron signal profile of the inspection pattern to a scanning electron microscope secondary electron signal profile of a sample pattern.

2. A computer program product according to claim 1 wherein the computer-readable program code that is configured to determine whether the inspection pattern is defective comprises computer-readable program code that is configured to determine that the inspection pattern is not defective if comparing the scanning electron microscope picture of the inspection pattern to the scanning electron microscope picture of the sample pattern indicates that the inspection pattern is defective, but comparing the scanning electron microscope secondary electron signal profile of the inspection pattern to the scanning electron microscope secondary electron signal profile of the sample pattern indicates that the inspection pattern is not defective.

3. A computer program product according to claim 1 wherein the computer-readable program code that is configured to determine whether the inspection pattern is defective comprises computer-readable program code that is configured to determine whether the inspection pattern is defective by first comparing the scanning electron microscope picture of the inspection pattern to a scanning electron microscope picture of a sample pattern and by then comparing the scanning electron microscope secondary electron signal profile of the inspection pattern to a scanning electron microscope secondary electron signal profile of a sample pattern.

4. A computer program product that is configured to inspect a pattern, the computer program product comprising a computer usable storage medium having computer-readable program code embodied in the medium, the computer-readable program code comprising:

computer-readable program code that is configured to acquire a scanning electron microscope secondary electron signal profile of an inspection pattern using a scanning electron microscope picture of the inspection pattern;

computer-readable program code that is configured to determine whether the inspection pattern is defective by comparing the scanning electron microscope secondary electron signal profile of the inspection pattern to a scanning electron microscope secondary electron signal profile of a sample pattern; and computer-readable program code that is configured to measure a width of the scanning electron microscope secondary electron signal profile of the inspection pattern in response to determining that the inspection pattern is not defective.

* * * * *